(12) United States Patent
Morgan (10) Patent No.: US 9,541,586 B2
(45) Date of Patent: Jan. 10, 2017

(54) CAPTURE OF POWER QUALITY INFORMATION AT THE TIME A DEVICE FAILS

(71) Applicant: Rockwell Automation Technologies, Inc., Mayfield Heights, OH (US)

(72) Inventor: Richard A Morgan, Milwaukee, WI (US)

(73) Assignee: ROCKWELL AUTOMATION TECHNOLOGIES, INC., Mayfield Heights, OH (US)

( * ) Notice: Subject to any disclaimer, the term of this patent is extended or adjusted under 35 U.S.C. 154(b) by 255 days.

(21) Appl. No.: 14/552,114

(22) Filed: Nov. 24, 2014

(65) Prior Publication Data

US 2016/0146865 A1     May 26, 2016

(51) Int. Cl.
*G01R 31/40* (2014.01)
*G01R 21/06* (2006.01)
(Continued)

(52) U.S. Cl.
CPC .......... *G01R 21/06* (2013.01); *G01R 19/2513* (2013.01); *H02H 1/0007* (2013.01);
(Continued)

(58) Field of Classification Search
CPC .......... G01R 31/40; G01R 31/42; G01R 1/20; G01R 1/22; G01R 1/203; G01R 15/146; G01R 19/0007
See application file for complete search history.

(56) References Cited

U.S. PATENT DOCUMENTS 3,569,785 A   3/1971 Durbeck et al.
3,931,502 A   1/1976 Kohlas
(Continued)

FOREIGN PATENT DOCUMENTS

DE   10017265 A1   10/2001
EP   0084191 B1    11/1982
(Continued)

OTHER PUBLICATIONS

Kazemi et al., Review of Voltage Sag Source Identification Methods for Power Quality Diagnosis, Przeglad Elektrotechniczny, ISSN 0033-2097, R. 89 NR Aug. 2013, pp. 143-149, University Kebangsaan Malaysia (UKM).
(Continued)

*Primary Examiner* — Tung X Nguyen
(74) *Attorney, Agent, or Firm* — Kunzler Law Group (57) ABSTRACT

An apparatus for detecting an abnormal event and capturing associated waveforms includes a detection module within a power control device that detects an abnormal condition. The abnormal condition is indicative of an impending failure of the power control device and/or a condition within the power control device indicative of a parameter being outside of a specified limit. The power control device controls power to one or more power devices in a power distribution system. The apparatus includes a signal transmit module that transmits a capture signal to a transient capture meter. The transient capture meter meters transient conditions of a branch of the power distribution system that includes the power control device. The capture signal instructs the transient capture meter to capture current and/or voltage waveforms relevant to a time when the detection module detected the abnormal condition.

20 Claims, 4 Drawing Sheets

(51) Int. Cl.
*G01R 19/25* (2006.01)
*H02H 1/00* (2006.01)
*H02J 3/00* (2006.01)

(52) U.S. Cl.
CPC ......... *H02H 1/0053* (2013.01); *H02H 1/0061* (2013.01); *H02J 2003/001* (2013.01)

(56) References Cited

U.S. PATENT DOCUMENTS

| | | | |
|---|---|---|---|
| 4,063,160 A | 12/1977 | Lanz et al. | |
| 4,063,162 A | 12/1977 | Lanz et al. | |
| 4,110,684 A | 8/1978 | Gale | |
| 4,128,805 A | 12/1978 | Lanz | |
| 4,224,672 A | 9/1980 | Leleu et al. | |
| 4,245,150 A | 1/1981 | Driscoll et al. | |
| 4,251,766 A | 2/1981 | Souillard | |
| 4,352,137 A | 9/1982 | Johns | |
| 4,362,986 A | 12/1982 | Burke et al. | |
| 4,446,458 A | 5/1984 | Cook | |
| 4,499,417 A | 2/1985 | Wright et al. | |
| 4,510,571 A | 4/1985 | Dagostino et al. | |
| 4,560,922 A | 12/1985 | Heller et al. | |
| 4,570,231 A | 2/1986 | Bunch | |
| 4,589,074 A | 5/1986 | Thomas et al. | |
| 4,591,992 A | 5/1986 | Yamaura | |
| 4,599,556 A | 7/1986 | Lanz | |
| 4,612,617 A | 9/1986 | Laplace, Jr. et al. | |
| 4,641,246 A | 2/1987 | Halbert et al. | |
| 4,694,402 A | 9/1987 | McEachern et al. | |
| 4,731,689 A | 3/1988 | Nimmersjo et al. | |
| 4,755,887 A | 7/1988 | Deaver et al. | |
| 4,774,621 A | 9/1988 | Andow | |
| 4,797,805 A | 1/1989 | Nimmersjo et al. | |
| 4,908,622 A | 3/1990 | Turai | |
| 5,151,866 A | 9/1992 | Glaser et al. | |
| 5,153,501 A | 10/1992 | Shimada et al. | |
| 5,216,621 A | 6/1993 | Dickens | |
| 5,224,054 A | 6/1993 | Wallis | |
| 5,229,651 A | 7/1993 | Baxter, Jr. et al. | |
| 5,233,538 A | 8/1993 | Wallis | |
| 5,343,404 A | 8/1994 | Girgis | |
| 5,453,744 A | 9/1995 | VanDeusen et al. | |
| 5,498,956 A | 3/1996 | Kinney et al. | |
| 5,528,134 A | 6/1996 | Davis et al. | |
| 5,568,399 A | 10/1996 | Sumic | |
| 5,587,917 A | 12/1996 | Elms | |
| 5,608,327 A * | 3/1997 | Jones | H02H 7/267 324/522 |
| 5,627,759 A | 5/1997 | Bearden et al. | |
| 5,706,204 A | 1/1998 | Cox et al. | |
| 5,717,325 A | 2/1998 | Leeb et al. | |
| 5,796,259 A | 8/1998 | Dickmander | |
| 5,808,902 A | 9/1998 | Levert et al. | |
| 5,819,203 A | 10/1998 | Moore et al. | |
| 5,825,656 A | 10/1998 | Moore et al. | |
| 5,828,983 A | 10/1998 | Lombardi | |
| 5,899,960 A | 5/1999 | Moore et al. | |
| 5,966,675 A | 10/1999 | Koeck | |
| 6,137,283 A | 10/2000 | Williams et al. | |
| 6,320,577 B1 | 11/2001 | Alexander | |
| 6,360,178 B1 | 3/2002 | Parsons et al. | |
| 6,415,244 B1 | 7/2002 | Dickens et al. | |
| 6,429,785 B1 | 8/2002 | Griffin et al. | |
| 6,449,570 B1 | 9/2002 | Wilstrup et al. | |
| 6,516,279 B1 | 2/2003 | Jansen et al. | |
| 6,615,147 B1 | 9/2003 | Jonker et al. | |
| 6,615,162 B2 | 9/2003 | Bar-Or | |
| 6,675,071 B1 | 1/2004 | Griffin, Jr. et al. | |
| 6,708,124 B2 | 3/2004 | Bilas et al. | |
| 6,792,364 B2 | 9/2004 | Jonker et al. | |
| 6,987,389 B1 * | 1/2006 | Macbeth | H02H 1/0015 324/536 |
| 6,989,977 B2 | 1/2006 | Kase et al. | |
| 7,006,934 B2 | 2/2006 | Jonker et al. | |
| 7,016,796 B2 | 3/2006 | Damle et al. | |
| 7,106,045 B2 | 9/2006 | Jungwirth et al. | |
| 7,138,924 B2 | 11/2006 | Curtis | |
| 7,209,804 B2 | 4/2007 | Curt et al. | |
| 7,282,921 B2 | 10/2007 | Sela et al. | |
| 7,342,507 B2 | 3/2008 | Jonker et al. | |
| 7,403,364 B2 | 7/2008 | Anderson et al. | |
| 7,469,190 B2 | 12/2008 | Bickel | |
| 7,526,391 B2 | 4/2009 | Bickel | |
| 7,571,063 B2 | 8/2009 | Howell et al. | |
| 7,639,129 B2 | 12/2009 | Bickel et al. | |
| 7,772,829 B2 | 8/2010 | Shuey | |
| 8,000,913 B2 | 8/2011 | Kreiss et al. | |
| 8,077,049 B2 | 12/2011 | Yaney et al. | |
| 8,160,824 B2 | 4/2012 | Spanier et al. | |
| 8,184,016 B2 | 5/2012 | Gray et al. | |
| 8,190,381 B2 | 5/2012 | Spanier et al. | |
| 8,280,656 B2 | 10/2012 | Kreiss et al. | |
| 8,285,500 B2 | 10/2012 | Kreiss et al. | |
| 8,290,727 B2 | 10/2012 | Kreiss et al. | |
| 8,336,352 B2 | 12/2012 | Abiprojo et al. | |
| 8,401,985 B2 | 3/2013 | Bickel et al. | |
| 2002/0027733 A1 | 3/2002 | Kikuta et al. | |
| 2002/0072867 A1 | 6/2002 | Parsons et al. | |
| 2002/0145517 A1 | 10/2002 | Papallo, Jr. et al. | |
| 2003/0014200 A1 | 1/2003 | Jonker et al. | |
| 2009/0187284 A1 | 7/2009 | Kreiss et al. | |
| 2009/0261805 A1 | 10/2009 | Shuey | |
| 2010/0013496 A1 | 1/2010 | Goetz | |
| 2010/0324845 A1 | 12/2010 | Spanier et al. | |
| 2011/0270454 A1 | 11/2011 | Kreiss et al. | |
| 2011/0270457 A1 | 11/2011 | Kreiss et al. | |
| 2011/0270550 A1 | 11/2011 | Kreiss et al. | |
| 2012/0050065 A1 | 3/2012 | Lombardi | |
| 2012/0209552 A1 | 8/2012 | Spanier et al. | |
| 2013/0110425 A1 | 5/2013 | Sharma et al. | |
| 2013/0123997 A1 | 5/2013 | King et al. | |

FOREIGN PATENT DOCUMENTS

| | | |
|---|---|---|
| WO | 0010018 | 2/2000 |
| WO | 0113132 A1 | 2/2001 |
| WO | 2012061014 A1 | 5/2012 |
| WO | 2013001355 | 1/2013 |

OTHER PUBLICATIONS

Wong Ling Ai et al., A Single Monitor Method for Voltage Sag Source Location using Hilbert Huang Transform, Research Journal of Applied Sciences, Engineering and Technology 5(1): 192-202, 2013, ISSN: 2040-7459; e-ISSN: 2040-7467, © Maxwell Scientific Organization, 2013, Published: Jan. 1, 2013.

Eassa et al., Prediction of Electrical Power Quality Disturbances Using State Estimation Techniques, 18th International Conference on Electricity Distribution, Turin, Jun. 6-9, 2005.

Hamzah et al., A new approach to locate the voltage sag source using real current component, Electric Power Systems Research 72 (2004) 113-123.

Makaliki, Voltage Sag Source Location in Power Systems, Master Thesis, Institutionen for Energi och Miljö, Sweden, Dec. 2006.

Parsons et al., A Direction Finder for Power Quality Disturbances Based Upon Disturbance Power and Energy, Paper accepted for presentation at the 8th International Conference on Harmonics and Quality of Power ICHQP '98, jointly organized by IEEE/PES and NTUA, Athens, Greece, Oct. 14-16, 1998, pp. 693-699.

Polajzer et al., Generalization of Methods for Voltage-Sag Source Detection Using Vector-Space Approach, IEEE Transactions on Industry Applications, vol. 45, No. 6, Nov./Dec. 2009.

Dong-Jun Won, A New Algorithm to Locate Power-Quality Event Source With Improved Realization of Distributed Monitoring Scheme, IEEE Transactions on Power Delivery, vol. 21, No. 3, Jul. 2006.

EnerVista Viewpoint Monitoring, GE Digital Energy, http://www.gedigitalenergy.com/products/brochures/EVMon.pdf, 2005.

(56) References Cited

OTHER PUBLICATIONS

PQM II, power quality meter, Power Quality and Energy Cost Management, GE Energy, http://www.gedigitalenergy.com/products/brochures/pqmii.pdf, 2011.
Li et al., Method for voltage-sag-source detection by investigating slope of the system trajectory, IEE Proc.-Gener. Transm. Distrib., vol. 150, No. 3, May 2003.
Parsons et al., Rules for Locating the Sources of Capacitor Switching Disturbances, IEEE, pp. 794-799, Jul. 22, 1999.
Kim et al., A Time-Domain Procedure for Locating Switched Capacitors in Power Distribution Systems, IEEE Transactions on Power Delivery, vol. 17, No. 4, Oct. 2002.
Gengyin et al., Research on Power Quality Disturbance Automatic Recognition and Location, IEEE, pp. 687-691, Jul. 17, 2003.
Gu et al., Time-frequency and time-scale domain analysis of voltage disturbances, IEEE Transactions on Power Delivery, vol. 15, No. 4, Oct. 2000.
Powerlogic Solutions, Power Quality—Where Did That Event Come From?, www.powerlogic.com, vol. 7, Issue 2, Sep. 2003.
Schneider Electric, ION7550/ION7650—High performance meters for utility networks, mains or critical loads on HV/LV networks, http://www.schneider-electric.com/products/us/en/52500-power-and-energy-monitoring-system/52520-energy-and-power-quality-meters/1460-ion7550-ion7650/, Last retrieved May 16, 2014.
Schneider Electric, CM4000—High performance meters for mains or critical loads on HV/LV networks, http://www.schneider-electric.com/products/us/en/52500-power-and-energy-monitoring-system/52520-energy-and-power-quality-meters/921-cm4000/, Last retrieved May 16, 2014.
Schweitser Engineering Laboratories, Legacy SEL-351 Directional Overcurrent and Reclosing Relay, https://www.selinc.com/LegacySEL-3511, Last retrieved May 28, 2014.
Schweitser Engineering Laboratories, SEL-PROFILE® Fault Locating Analysis Program, https://www.selinc.com/SEL-PROFILE/, Last retrieved May 28, 2014.
Dranetz, Modular Power Monitoring System: Encore, http://dranetz.com/encore-series, Last retrieved May 28, 2014.
Karl Zimmerman and David Costello, Fundamentals and Improvements for Directional Relays, Previously presented at the 2010 Texas A&M Conference for Protective Relay Engineers.
PQView, Capacitor Switching Answer Module, http://www.pqview.com/capswitch, Last retrieved May 28, 2014.
PQView, Sag Directivity Answer Module, http://www.pqview.com/sag-directivity, Last retrieved May 28, 2014.
PQView, PQView 3.61.0 Released, http://www.pqview.com/new/2009/7/24/pqview-3610-released.html, Jul. 24, 2009.
PQView, PQView 3.75.5 Released, http://www.pqview.com/new/2013/4/1/pqview-3755-released.html, Apr. 1, 2013.
PQView, PQView 3.76.0 Released, http://www.pqview.com/new/2013/10/24/pqview-3760-released.html, Oct. 24, 2013.
PQView, PQView 3.65.1 Released, http://www.pqview.com/new/2010/5/12/pqview-3651-released.html, May 12, 2010.
PQView—The Industry Standard for Power Quality Database Management and Analysis Software, http://www.pqview.com/, Last retrieved May 28, 2014.
Schweitser Engineering Laboratories, Detect More Faults Than Ever Before With Arc Sense Technology, https://www.selinc.com/ArcSense/, Last retrieved May 28, 2014.
Schweitser Engineering Laboratories, Legacy SEL-351 Directional Overcurrent and Reclosing Relay, https://www.selinc.com/LegacySEL-351/, Last retrieved May 28, 2014.

* cited by examiner

CAPTURE OF POWER QUALITY INFORMATION AT THE TIME A DEVICE FAILS

FIELD

The subject matter disclosed herein relates to transient capture and more particularly relates to capturing transient waveforms surrounding an abnormal condition within a power control device.

BACKGROUND INFORMATION

Many power distribution systems include power control devices such as variable frequency drives ("VFDs") that control motor speed, smart motor controllers that use various methods to soft start motors to prevent high inrush current, and other devices with advanced monitoring capabilities. The power control devices often have the capability to detect component problems and abnormal conditions within the power control device. Some of the problems occur before or during a failure of the power control device. Other problems, such as voltage, current, temperature, etc. of a component may affect how the power control device performs. However, typical monitoring within a power control device may be inadequate in determining a cause of an abnormal condition, such as a failure of the power control device, a component out of spec, etc. or may be inadequate in determining an effect of an abnormal condition on the power distribution system.

BRIEF DESCRIPTION

An apparatus for detecting an abnormal event and capturing associated waveforms is disclosed. A method also performs the functions of the apparatus. The apparatus includes a detection module within a power control device that detects an abnormal condition. The abnormal condition is indicative of an impending failure of the power control device and/or a condition within the power control device indicative of a parameter being outside of a specified limit. The power control device controls power to one or more power devices in a power distribution system. The apparatus includes a signal transmit module that transmits a capture signal to a transient capture meter. The transient capture meter meters transient conditions of a branch of the power distribution system that includes the power control device. The capture signal instructs the transient capture meter to capture current and/or voltage waveforms relevant to a time when the detection module detected the abnormal condition.

In one embodiment, the signal transmit module transmits the capture signal over a control communication network. In a related embodiment, the control communication network transmits control signals to a plurality of power control devices that control power to power devices in the power distribution system and to one or more transient capture meters. In another related embodiment, the control communication network uses a transmission pathway different than power transmission within the power distribution system.

In one embodiment, the signal transmit module also transmits the capture signal to additional transient capture meters that meter the power distribution system at various locations. In another embodiment, detecting the impending failure of the power control device includes detecting an impending failure of a component in the power control device and/or detecting a condition in the power control device known to cause a component in the power control device to fail. In another embodiment, detecting the condition within the power control device indicative of a parameter being outside of a specified limit includes detecting a control signal is outside of a specified range, detecting a voltage of a component being outside of a specified range, detecting a current of a component being outside of a specified range, and/or detecting a power signal outside of a power quality limit.

In one embodiment, the transient capture meter includes a buffer that stores waveforms of a sufficient time period to capture transient data at least at the time that the detection module detects the abnormal condition accounting for delays between receipt of the capture signal and detection of the abnormal condition. In another embodiment, the apparatus includes an event data module that transmits data related to the abnormal condition. In a further embodiment, the data related to the abnormal condition includes data related to failure of the power control device and/or data related to the condition within the power control device indicative of the parameter being outside of the limit. In another embodiment, the data related to the abnormal condition includes data not available external to the power control device. In another embodiment, the capture signal includes a time when the detection module detected the abnormal condition.

A method for detecting an abnormal event and capturing associated waveforms includes detecting, within a power control device, an abnormal condition. The abnormal condition is indicative of an impending failure of the power control device and/or a condition within the power control device indicative of a parameter being outside of a specified limit. The power control device controls power to one or more power devices in a power distribution system. The method includes transmitting a capture signal to a transient capture meter. The transient capture meter meters transient conditions of a branch of the power distribution system that includes the power control device. The capture signal instructs the transient capture meter to capture current and/or voltage waveforms relevant to a time when the abnormal condition is detected.

In one embodiment, transmitting the capture signal to a transient capture meter includes transmitting the capture signal over a control communication network. In another embodiment, transmitting the capture signal includes transmitting the capture signal to a plurality of transient capture meters that meter the power distribution system at various locations. In another embodiment, the transient capture meter includes a buffer that stores waveforms of a sufficient time period to capture transient data at least at the time of detecting the abnormal condition accounting for delays between receipt of the capture signal and detection of the abnormal condition.

Another apparatus for detecting an abnormal event and capturing associated waveforms includes a signal receiver module within a transient capture meter that receives a transient capture signal from a power control device. The transient capture meter meters transient conditions of a branch of a power distribution system that includes the power control device. The power control device controls power to one or more power devices in the power distribution system. The power control device detects an abnormal condition and transmits the capture signal to the transient capture meter in response to detecting the abnormal condition. The abnormal condition is indicative of an impending failure of the power control device and/or a condition within the power control device indicative of a parameter being outside of a specified limit. The apparatus includes a transient capture module, within the transient capture meter, that captures current and/or voltage waveforms relevant to a time when the power control device detected the abnormal condition.

In one embodiment, the apparatus includes a signal transmit module that transmits the capture signal to additional transient capture meters. In another embodiment, the capture signal is received over a control communication network. In another embodiment, the transient capture meter includes a buffer that stores waveforms of a sufficient time period to capture transient data at least at the time that the power control device detects the abnormal condition accounting for delays between receipt of the capture signal and detection of the abnormal condition.

BRIEF DESCRIPTION OF THE DRAWINGS

In order that the advantages of the embodiments of the invention will be readily understood, a more particular description of the embodiments briefly described above will be rendered by reference to specific embodiments that are illustrated in the appended drawings. Understanding that these drawings depict only some embodiments and are not therefore to be considered to be limiting of scope, the embodiments will be described and explained with additional specificity and detail through the use of the accompanying drawings, in which.

DETAILED DESCRIPTION

Reference throughout this specification to "one embodiment," "an embodiment," or similar language means that a particular feature, structure, or characteristic described in connection with the embodiment is included in at least one embodiment. Thus, appearances of the phrases "in one embodiment," "in an embodiment," and similar language throughout this specification may, but do not necessarily, all refer to the same embodiment, but mean "one or more but not all embodiments" unless expressly specified otherwise. The terms "including," "comprising," "having," and variations thereof mean "including but not limited to" unless expressly specified otherwise. An enumerated listing of items does not imply that any or all of the items are mutually exclusive and/or mutually inclusive, unless expressly specified otherwise. The terms "a," "an," and "the" also refer to "one or more" unless expressly specified otherwise.

Furthermore, the described features, advantages, and characteristics of the embodiments may be combined in any suitable manner. One skilled in the relevant art will recognize that the embodiments may be practiced without one or more of the specific features or advantages of a particular embodiment. In other instances, additional features and advantages may be recognized in certain embodiments that may not be present in all embodiments.

The present invention may be a system, a method, and/or a computer program product. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory ("RAM"), a read-only memory ("ROM"), an erasable programmable read-only memory ("EPROM" or Flash memory), a static random access memory ("SRAM"), a portable compact disc read-only memory ("CD-ROM"), a digital versatile disk ("DVD"), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Smalltalk, C++ or the like, and conventional procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Many of the functional units described in this specification have been labeled as modules, in order to more particularly emphasize their implementation independence. For example, a module may be implemented as a hardware circuit comprising custom VLSI circuits or gate arrays, off-the-shelf semiconductors such as logic chips, transistors, or other discrete components. A module may also be implemented in programmable hardware devices such as field programmable gate arrays, programmable array logic, programmable logic devices or the like.

Modules may also be implemented in software for execution by various types of processors. An identified module of program instructions may, for instance, comprise one or more physical or logical blocks of computer instructions which may, for instance, be organized as an object, procedure, or function. Nevertheless, the executables of an identified module need not be physically located together, but may comprise disparate instructions stored in different locations which, when joined logically together, comprise the module and achieve the stated purpose for the module.

Furthermore, the described features, structures, or characteristics of the embodiments may be combined in any suitable manner. In the following description, numerous specific details are provided, such as examples of programming, software modules, user selections, network transactions, database queries, database structures, hardware modules, hardware circuits, hardware chips, etc., to provide a thorough understanding of embodiments. One skilled in the relevant art will recognize, however, that embodiments may be practiced without one or more of the specific details, or with other methods, components, materials, and so forth. In other instances, well-known structures, materials, or operations are not shown or described in detail to avoid obscuring aspects of an embodiment.

Figure 1:
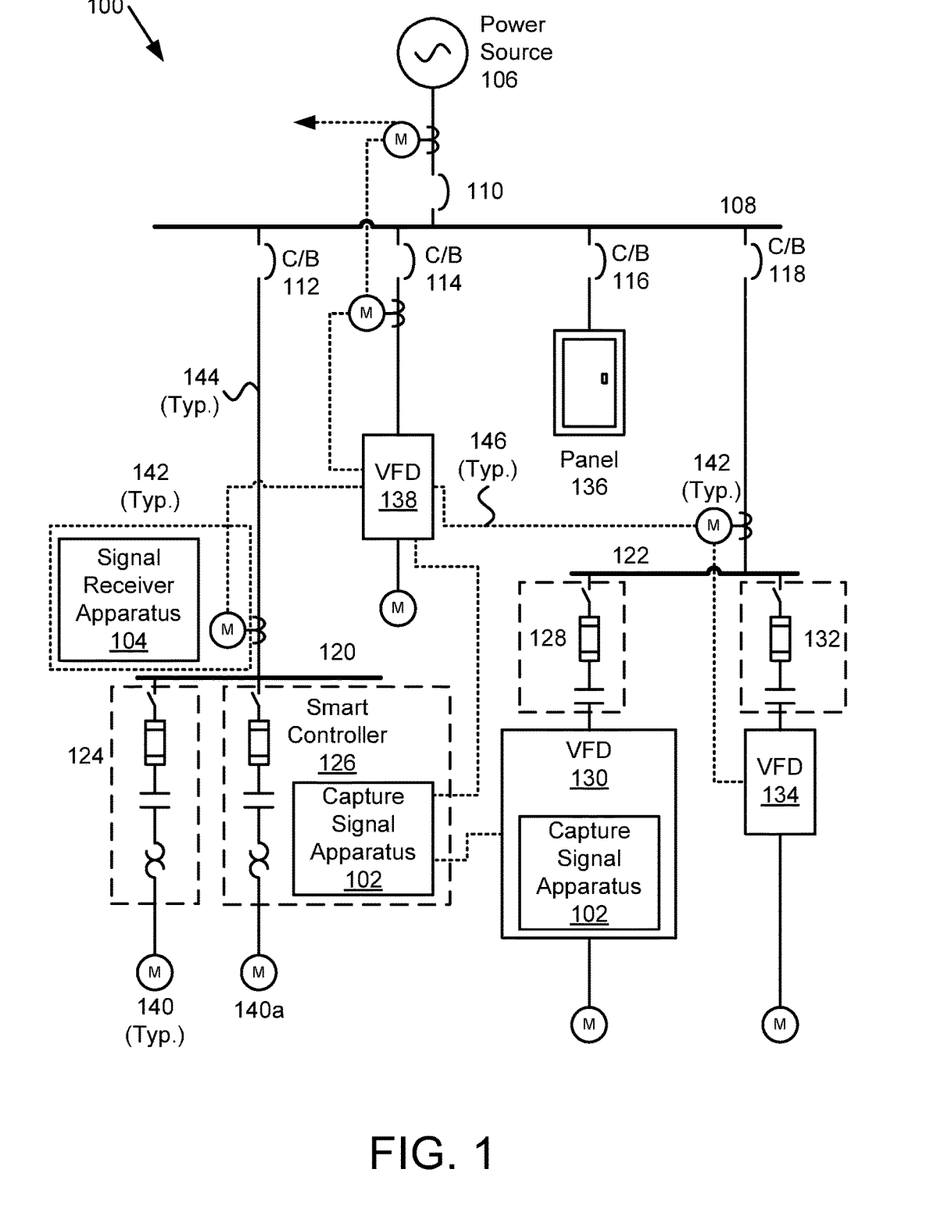
FIG. 1 is a schematic block diagram illustrating one embodiment of a system with a capture signal apparatus and a signal receiver apparatus.

FIG. 1 is a schematic block diagram illustrating one embodiment of a system 100 with a capture signal apparatus 102 and a signal receiver apparatus 104. The system 100, in one embodiment, includes a power source 106, a service entrance panel 108 with a service entrance disconnect 110, various circuit breakers 112-118, a first motor control center ("MCC") 120, a second MCC 122, a motor controller 124, a smart motor controller 126 with a capture signal apparatus 102, a fused disconnect and contactor 128 feeding a variable frequency drive ("VFD"), a second fused disconnect and contactor 132 feeding another VFD 134, a branch panel 136, a stand-alone VFD 138, various motors 140, transient capture meters 142, conductors 144, and a control communication network 146, which are described below.

The system 100 includes one or more capture signal apparatuses 102 and signal receiver apparatuses 104. A capture signal apparatus 102 is depicted in a VFD 130 and another capture signal apparatus 102 is depicted in a smart motor controller 126. In one embodiment, some or all VFDs (e.g. 130, 134, 138) include a capture signal apparatus 102. In another embodiment, some or all motor controllers (e.g. 124, 126) are smart motor controllers and include a capture signal apparatus 102. In another embodiment, each transient capture meter 142 includes a signal receiver apparatus 104. The capture signal apparatus 102 is described in more detail with respect to FIG. 2 and the signal receiver apparatus 104 is described in more detail with regard to FIG. 3.

In general, the capture signal apparatus 102 and the signal receiver apparatus 104 act together to provide additional information during a potential failure situation or a condition where a device is out of prescribed limits. For example, a power control device, such as a VFD (e.g. 130) or a smart controller (e.g. 126) may include a capability of monitoring various components and conditions within the power control device and may detect an abnormal condition, such as a condition indicative of a failure of the power control device or a condition within the power control device indicative of a parameter being outside of a specified limit.

For example, a switching device in a VFD (e.g. 130) that intermittently allows power flow to a load may overheat, which may be a known cause of a VFD failure. Other common failures may include a blown supply fuse, an unexpected shutdown of all or a portion of a power control device (e.g. 126, 130), component failure within the power control device (e.g. 126, 130) or in a downstream element, such as a power device (e.g. 140), or other failure known to those of skill in the art. In one example, the unexpected shutdown or component failure may not have evidence of cause and may be unexplained. The capture signal apparatus 102 may provide insight into the shutdown or failure.

The capture signal apparatus 102 may detect the abnormal condition and may send a capture signal to a signal receiver apparatus 104 in a transient capture meter 142. The transient capture meter 142 may then capture transient conditions. Where the transient capture meter 142 includes a buffer, the capture signal may include a timestamp associated with detection of the abnormal condition and the transient capture meter 142 may capture transients back at least to the timestamp. The captured transient waveforms may provide additional insight into reasons that the power control device failed or what happened as a result of the failure. Thus the embodiments of the invention described herein provide additional information that assists in determining a cause or an effect of an abnormal condition within a power control device.

The system 100 includes a typical power distribution system representative of various types of power distribution. Other power distribution systems may include transformers, switchgear, distribution panels, branch panels, and the like. The power distribution system depicted is intended to only be representative and one of skill in the art will recognize that other power distribution systems where the embodiments of the invention described herein may operate. Typically a power distribution system includes at least one power source 106. The power source 106 may provide an alternating current ("AC") voltage waveform and may be three-phase, two-phase, single-phase, etc. In another embodiment, the power source 106 provides direct current ("DC") power. The power source 106 may represent a feed from an electric utility company and may provide power through service entrance conductors or equipment, or may be another power source, such as an onsite power source, a generator, an uninterruptible power supply, a fuel cell, a solar generation system, etc. or a combination of typical power sources.

In some embodiments, the power source 106 is external to a facility and feeds service entrance cables which feed a service entrance panel 108, which may be protected by a service entrance disconnect 110. In the depicted embodiment, the service entrance disconnect 110 is depicted as a circuit breaker ("C/B"), but may be a fused disconnect, a disconnect switch, or the like. The service entrance panel 108 is depicted having circuit breakers 112-118, but may include fused disconnects, meters, power conditioning equipment, etc. The service entrance conductors or service entrance disconnect 110 may include a transient capture meter 142 that monitors power from the power source 106 to the service entrance panel 108.

In one embodiment, the power distribution system includes a first MCC 120 that may include several motor controllers 124, 126. The motor controllers 124, 126 may each include a disconnect of some type, such as a fused switch or circuit breaker, a contactor, a motor overload, etc. While two motor controllers 124, 126 are depicted, one of skill in the art will recognize that a motor control center may include numerous motor controllers of various types. The MCC 120 may include the motor controllers 126. In another embodiment, all or a portion of a motor controller 124, 126 may be external to the MCC 120. For example, the MCC may include a fused disconnect while the overload and contactors of the motor controller 124, 126 may be external to the MCC 120.

As depicted, one or more motor controllers may be smart motor controllers 126 with a capture signal apparatus 102 and with an ability to monitor and report abnormal conditions within the smart motor controller 126. In one embodiment, the smart motor controller 126 is a soft start motor controller that applies voltage to a motor 140a fed by the smart motor controller 126 in several steps or in a way to reduce inrush current to the motor 140a. In another embodiment, the smart motor controller 126 is a typical full voltage starter, a bidirectional starter, or the like, but includes a capability to monitor conditions within the smart motor controller 126. The first MCC 120 may also include a transient capture meter 142 that monitors conductors 144 between a circuit breaker 112 in the service entrance panel 108 and the first MCC 120. Other loads fed by the first MCC may also include a transient capture meter 142.

In one embodiment, the power distribution system includes a second MCC 122 that includes VFDs 130, 134. The VFDs 130, 134 typically are fed from a fused disconnect 128, 132, circuit breaker or other disconnect with overcurrent protection. The VFDs 130, 134 may be mounted in the MCC 122 or may be external to the MCC 122. One or more of the VFDs 130, 134 may have the ability to monitor for abnormal conditions, such as component failure, control bus voltage issues, power quality issues, etc. and may include a capture signal apparatus 102. Other motor control centers may have a combination of motor controllers (e.g. 124), smart motor controllers (e.g. 126), VFDs (e.g. 130, 134), fused switches, circuit breakers, etc. One or more of the MCCs 120, 122 may include a transient capture meter 142 monitoring the feeder to the MCC 120, 122, as depicted.

The power distribution system may also include one or more branch panels 136, which may be protected by a circuit breaker 116 or other overcurrent device in the service entrance panel 108 or other distribution panel or MCC 120, 122. The power distribution system also includes one or more motors 140, each controlled by a power control device, such as a VFD 130, 134, 138, smart motor controller 126, motor controller 124, and the like. The power control device may connect power to a motor 140, may control speed to a motor 140, may control startup of a motor 140, and the like. While the system 100 of FIG. 1 depicts a capture signal apparatus 102 in a smart motor controller 126 and a VFD 130, a capture signal apparatus 102 may be included in other devices, such as a power circuit breaker, switchgear, transient voltage surge suppressor, or other device that has a capability to monitor components, signals, etc. for an abnormal condition that may be indicative of a failure or a condition outside a specified limit.

The system 100 may also include a control communication network 146 that connects the capture signal apparatus 102 of power control devices and the signal receiver apparatuses 104 of the transient capture meters 142. The control communication network 146 is depicted in somewhat of a daisy-chain connection but one of skill in the art will recognize other network architectures that may be used for a control communication network 146. One control communication network connection to the transient capture meter 142 for the service entrance conductors is shown as an arrow, which may extend to a server or other control communication network device or controller.

The control communication network 146 includes cabling, switches, routers and the like and may use a particular communication protocol. For example, the communication protocol may be Ethernet/IP®, ControlNet®, DeviceNet®, Ethernet DLR (Ethernet/IP with DLR or Device Level Ring), Modbus® TCP/IP, Common Industrial Protocol ("CIP"), International Electrotechnical Commission ("IEC") 60870, IEC 61850, Profibus, SCADA (supervisory control and data acquisition), FOUNDATION fieldbus, or other control communication network known to those of skill in the art. The control communication network 146, in one embodiment, includes multiple communications buses. For example, the control communication network 146 may include a local area network ("LAN"), wireless network, the Internet, etc.

Figure 2:
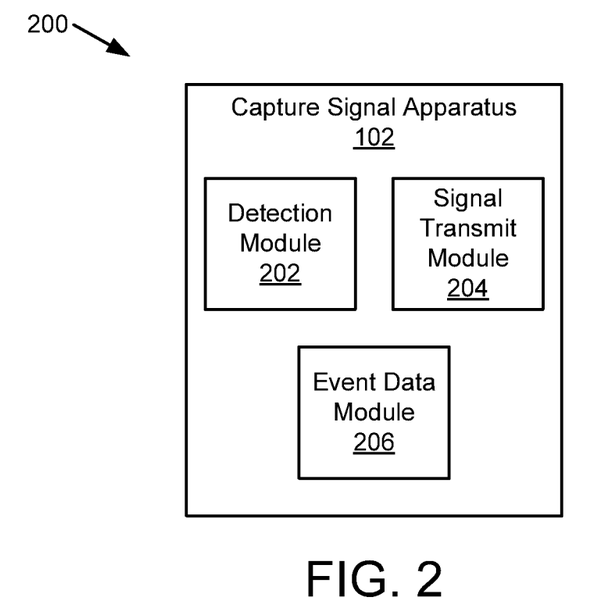
FIG. 2 is a schematic block diagram illustrating one embodiment of an apparatus for detecting an abnormal condition and sending a capture signal.

FIG. 2 is a schematic block diagram illustrating one embodiment of an apparatus 200 for detecting an abnormal condition and sending a capture signal. The apparatus 200 includes one embodiment of a capture signal apparatus 102 with a detection module 202 and a signal transmit module 204, and optionally an event data module 206, which are described below.

The apparatus 200, in one embodiment, includes a detection module 202 within a power control device that detects an abnormal condition. In another embodiment, the detection module 202 detects multiple abnormal conditions. The abnormal condition is indicative of an impending failure of the power control device and/or a condition within the power control device indicative of a parameter being outside of a specified limit. The power control device controls power to one or more power devices in a power distribution system. A power device may be a motor 140 or other device that consumes power, such as a branch panel 136, a lighting panel, a computer power supply, and the like. An abnormal condition indicative of an impending failure of the power control device may include a failure of a component within the power control device.

Detecting the impending failure of the power control device may include detecting an impending failure of a component in the power control device, detecting a condition in the power control device known to cause a component in the power control device to fail, etc. Detecting the condition within the power control device indicative of a parameter being outside of a specified limit may include detecting a control signal is outside of a specified range, detecting a voltage of a component being outside of a specified range, detecting a current of a component being outside of a specified range, detecting a power signal outside of a power quality limit, and the like. In one embodiment, the detection module 202 detects an abnormal condition when multiple devices or parameters are registering an error, have signals above a limit, etc. In the embodiment, a single condition of a particular device may not be sufficient to trigger the detection module 202, but a combination of conditions may indicate an abnormal condition. The detection module 202 may detect an abnormal condition for both single events and combination events.

For example, if the power control device is a smart motor controller 126, one component may be a contactor that is driven closed by a control bus voltage. If the control bus voltage is low, the contactor may chatter open and closed, which may overheat the contacts of the contactor which may weld the contacts shut. The detection module 202 may detect that the control bus voltage is low or below a threshold. The detection module 202 may detect an overvoltage condition, an under-voltage condition, an over-temperature condition, a fault in a processor, a failure flag, a power quality issue, a control power failure or abnormal condition, a signal failure, a combination of conditions, or other condition associated with the power control device indicative of a failure of a component or a failure of the power control device or a component or signal exceeding or being outside a limit. One of skill in the art will recognize other conditions or signals that the detection module 202 may detect within or associated with the power control device.

The apparatus 200 includes a signal transmit module 204 that transmits a capture signal to a transient capture meter 142. The transient capture meter 142 meters transient conditions of a branch of the power distribution system that includes the power control device. The capture signal instructs the transient capture meter 142 to capture current and/or voltage waveforms relevant to a time when the detection module 202 detected the abnormal condition. For example, the signal transmit module 204 may transmit a capture signal to a signal receiver apparatus 104 within a transient capture meter 142, which may instruct the transient capture meter 142 to capture transient voltages and/or currents. In another embodiment, the transient capture meter 142 captures other signals and conditions, such as communication signals and instructions, temperature, and the like.

In one embodiment, the signal transmit module 204 transmits the capture signal over a control communication network 146. In another embodiment, the control communication network 146 transmits control signals to a multiple power control devices that control power to power devices in the power distribution system and to one or more transient capture meters 142, as described above in relation to the system 100 of FIG. 1. In another embodiment, the control communication network 146 uses a transmission pathway different than power transmission within the power distribution system. For example, the control communication network 146 may have cabling separate from power cables of the power distribution system. In another embodiment, the control communication network 146 transmits some or all of the control signals to control the power control devices, transient capture meters 142, and other equipment over some power cables of the power distribution system. For example, the control communication network 146 may transmit over power conductors using a communication protocol and typically at a frequency much higher than a fundamental waveform of the power distribution system.

In one embodiment, the signal transmit module 204 also transmits the capture signal to additional transient capture meters 142 that meter the power distribution system at various locations. The additional transient capture meters 142 may then also capture transients associated with a time that the detection module 202 detected the abnormal condition.

In one embodiment, the transient capture meter 142 includes a buffer that stores waveforms of a sufficient time period to capture transient data at least at the time that the detection module 202 detected the abnormal condition accounting for delays between receipt of the capture signal and detection of the abnormal condition. For example, the transient power meter 142 may be a PowerMonitor 5000™ by Allen-Bradley® or similar meter with a buffer and capable of capturing and recording power quality waveforms and other transient conditions. Time delays may include delays associated with detecting the abnormal condition, delays in the detection module 202 and signal transmit module 204, delays along the control communication network 146, delays within the signal receiver apparatus 104, delays within the transient capture meter 142, and the like. In one embodiment, the capture signal includes a time when the detection module 202 detected the abnormal condition. The time in the capture signal, in another embodiment, is adjusted for any time delay prior to the detection module 202 detecting the abnormal condition, for example, if the power control device included some delay before communicating with the detection module 202.

In one embodiment, the transient capture meter 142 may store enough data points within a cycle of the voltage and current waveforms to identify variations within the waveform indicative of a power quality event. For example, the transient capture meter 142 may store at least 10 data points per half cycle for each measurement channel. A measurement channel may be a voltage measurement, a current measurement, etc. In a three-phase power system the transient capture meter 142 may store voltage data for each phase, a neutral, a grounding conductor, current data for each phase, the neutral, the grounding conductor, and other measurements known to those of skill in the art. In another embodiment, the transient capture meter 142 stores 1024 data points per cycle. In other embodiments, the transient capture meter 142 may store 10,000 data points per cycle. In other embodiments, the transient capture meter 142 may store instantaneous data or RMS data. The transient capture meter 142 may also have additional features and capabilities.

In another embodiment, each transient capture meter 142 includes an ability to store data before and after a power quality event, such as a time when the detection module 202 detected an abnormal condition or other transient condition in the power distribution system. For example, a transient capture meter 142 may store pre-event data from some time before the power quality event to the time of the power quality event. In another embodiment, each transient capture meter 142 stores event data. Event data, in one example, is from a start of a power quality event until the power quality event is over, for example, when voltages and currents are within specified ranges or within the specified ranges for a predetermined period of time. In another embodiment, each transient capture meter 142 stores post-event data for a time period after a power quality event is over. The pre-event data, event data, and/or post-event data may be sufficient to gather information about a failure condition or out of limits condition in the power control device.

In one embodiment, the apparatus 200 includes an event data module 206 that transmits data related to the abnormal condition. For example, the event data module 206 may send information detected by the detection module 202. If the detection module 202, for instance, detects a temperature of a device in the power control device that is above a limit, the event data module 206 may transmit information about the device that is overheating, the temperature of the device, the threshold temperature, etc. In another embodiment, the event data module 206 may send a code, a flag, or other signal that indicates the detected abnormal condition.

In another embodiment, the event data module 206 sends other pertinent data related to the power control device. For example, the event data module 206 may send data of other devices within the power control device, waveforms, temperatures, status messages, and the like. In another embodiment, the event data module 206 works in conjunction with the signal transmit module 204 to include the data related to the abnormal condition in the capture signal. One of skill in the art will recognize other data that the event data module 206 may transmit that is related to the abnormal condition, related to operation of the power control device, etc. that may be useful in analyzing a failure condition or out of spec limit in the power control device.

Figure 3:
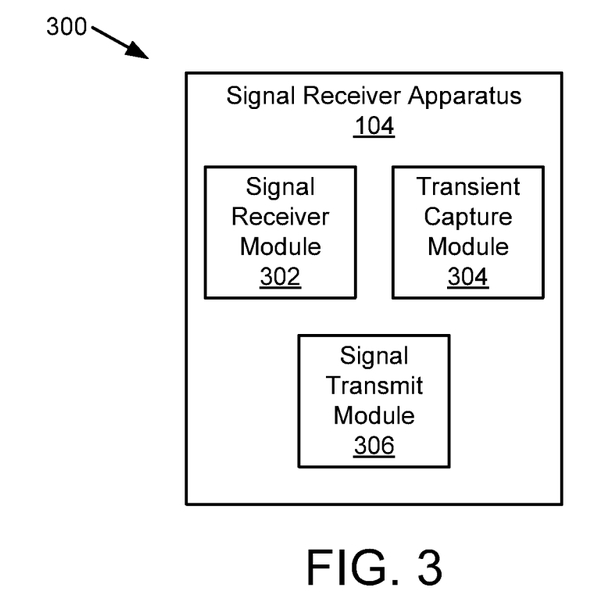
FIG. 3 is a schematic block diagram illustrating one embodiment of an apparatus for receiving a capture signal and capturing transient waveforms.

FIG. 3 is a schematic block diagram illustrating one embodiment of an apparatus 300 for receiving a capture signal and capturing transient waveforms. The apparatus 300 includes one embodiment of a signal receiver apparatus 104 with a signal receiver module 302, a transient capture module 304, and optionally a signal transmit module 306, which are described below.

The apparatus 300 includes a signal receiver module 302 within a transient capture meter 142 that receives a transient capture signal from a power control device. The transient capture meter 142, in one embodiment, meters transient conditions of a branch of a power distribution system that includes the power control device. In another embodiment, the transient capture meter 142 meters transient conditions of a different branch or a different portion of the power distribution system than the branch that includes the power control device. The power control device controls power to one or more power devices in the power distribution system.

The power control device, such as a smart motor controller 126 or a VFD 130, detects an abnormal condition and transmits the capture signal to the transient capture meter 142 in response to detecting the abnormal condition. The abnormal condition is indicative of an impending failure of the power control device and/or a condition within the power control device indicative of a parameter being outside of a specified limit.

In one embodiment, the signal receiver module 302 receives the capture signal over the control communication network 146. In one example, the power control device sends the capture signal to a nearest transient capture meter 142. In another example, the power control device sends the capture signal to additional transient capture meters 142. The capture signal may be addressed to one transient capture meter 142 or may be addressed to multiple transient capture meters 142 or may be a generic signal without a specific address to a particular transient capture meter 142 that is acted upon by the signal receiver module 302 to receive the capture signal.

The apparatus 300 includes a transient capture module 304, within the transient capture meter 142, that captures current and/or voltage waveforms relevant to a time when the power control device detected the abnormal condition. In one embodiment, the capture signal includes a timestamp of when the power control device detected the abnormal condition and the transient capture module 304 uses the timestamp to capture transient conditions at the time of the abnormal event and resulting waveforms associated with any event that may have been caused by the abnormal condition. For example, the transient capture meter 142 may include memory and a buffer that keeps past waveforms for a certain time period so that waveforms at the time of the abnormal condition are available even when the capture signal arrives at a later time. In another example, time delay between detection of an abnormal condition and receiving a capture signal is known or estimated and the transient capture module 304 captures waveforms based on the known or estimated time delay.

As used herein capturing transient conditions may include variations to typical power waveforms but may also include waveforms that are typical. For example, if an abnormal condition affects the power distribution system, a transient capture meter 142 may capture transients and other waveforms associated with the abnormal condition. If the abnormal event does not affect the power distribution system, the transient capture meter 142 may capture waveforms, which may not display transients, before, during and/or after the abnormal condition.

In another embodiment, the transient capture module 304 captures waveforms prior to the abnormal condition, for example, to get baseline signals prior to the abnormal condition, to capture waveforms that may have caused the abnormal condition, etc. The transient capture module 304 may also capture waveforms a sufficient time after the abnormal condition to capture any transient, result of failure within the power control device, effect of a component exceeding a limit, etc. In addition the transient capture module 304 may capture time after a transient, for example when the power distribution system has settled down. One of skill in the art will recognize other appropriate time frames for the transient capture module 304 to capture waveforms.

In one embodiment, the apparatus 300 includes a signal transmit module 306 that transmits the capture signal to additional transient capture meters 142. For example, if the power control device transmits the capture signal to the signal receiver module 302, the signal transmit module 306 may send the capture signal to other transient capture meters 142. For example, the transient capture meter 142 with the apparatus 300 may be wired directly to the power control device and the transient capture meter 142 may then relay the capture signal to other transient capture meters 142. In another embodiment, the power control device is connected to more than one transient capture meter 142 but the signal transmit module 306 transmits the capture signal for redundancy. In one embodiment, the signal transmit module 204 of the apparatus 200 of FIG. 2 is similar or identical to the signal transmit module 306 of the apparatus 300 of FIG. 3.

Figure 4:
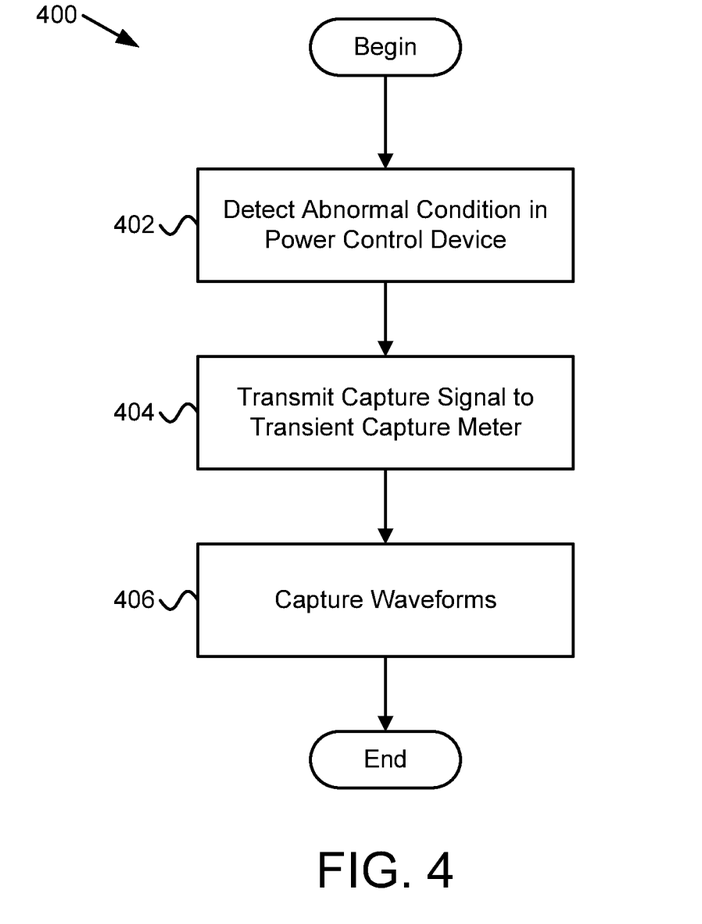
FIG. 4 is a schematic flow chart diagram illustrating one embodiment of a method for capturing waveforms after an abnormal condition.

FIG. 4 is a schematic flow chart diagram illustrating one embodiment of a method 400 for capturing waveforms after an abnormal condition. The method 400 begins and detects 402 within a power control device, an abnormal condition. The abnormal condition is indicative an impending failure of the power control device and/or a condition within the power control device indicative of a parameter being outside of a specified limit. The power control device controls power to one or more power devices in a power distribution system. In one embodiment, the detection module 202 detects the abnormal condition.

The method 400 transmits 404 a capture signal to a transient capture meter 142. The transient capture meter 142 meters transient conditions of a branch of the power distribution system that includes the power control device. The method 400 captures 406 current and/or voltage waveforms relevant to a time when the abnormal condition is detected, and the method 400 ends. In one embodiment, the signal transmit module 204 transmits 404 the capture signal. In another embodiment, the transient capture meter 142 captures 406 the current and voltage waveforms, for example, using the transient capture module 304.

Figure 5:
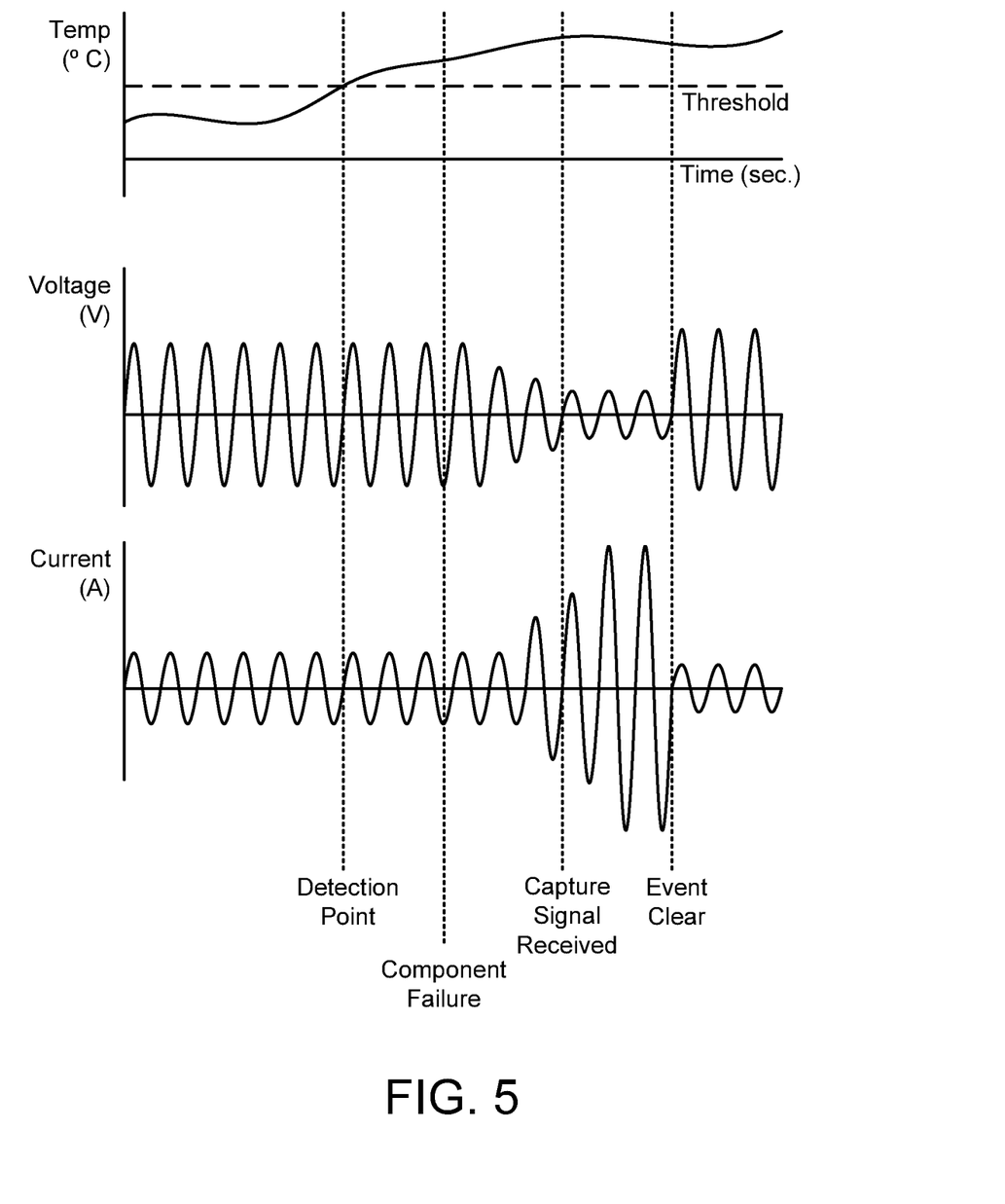
FIG. 5 is a diagram illustrating possible waveforms and timing for an abnormal event.

FIG. 5 is a diagram illustrating possible waveforms and timing for an abnormal event. The top waveform represents a possible temperature profile of a component in the power control device, such as a switching device in a VFD 130. Temperature is on the vertical axis and time is on the horizontal axis. The temperature increases beyond a threshold and the detection module 202 detects the over-temperature condition, which is depicted as the detection point. The middle waveform is representative of a voltage waveform, for example on a conductor 144 of the power distribution system. For example, the voltage waveform may be measured by the transient capture meter 142 in the branch feeding the second MCC 122 and the temperature may be for a component in the VFD 130 fed by the second MCC 122. Voltage is on the vertical axis and time on the horizontal axis. The third waveform represents current and may be measured by the transient capture meter 142 on the branch feeding the second MCC 122. Current is on the vertical axis and time on the horizontal axis. The time on the horizontal axis for each of the waveforms may be the same time frame.

In the example in FIG. 5, a component in the power control device fails at a time after detection of the over-temperature condition, which may then affect voltage and current. For example, the voltage may decrease and the current may increase, as may be seen for a fault condition. After the component fails, the transient capture meter 142 may receive the capture signal, and at a time after that the event may clear, for example by opening the overcurrent protection device 128 feeding the VFD 130. After clearing of the event, the voltage waveform may return to a condition similar to prior to the component failure and the current may be reduced due to a reduced load after opening of the overcurrent protection device 128 feeding the VFD 130 and motor 140 controlled by the VFD 130. In the example depicted in FIG. 5, if the transient capture meter 142 has a buffer, the transient capture meter 142 may be able to capture waveforms at least as early as the detection point. The waveforms illustrate the benefit of the embodiments of the invention described herein, but are not intended to be actual waveforms. One of skill in the art will recognize other situations and conditions where detection of an abnormal condition, sending a capture signal in response to detecting the abnormal condition, and then capturing waveforms relative to the time of the detection would be useful.

The described examples and embodiments are to be considered in all respects only as illustrative and not restrictive. This written description uses examples and embodiments to disclose the invention, including best mode, and also to enable any person skilled in the art to practice the invention, including making and using any devices or systems and performing any incorporated methods. The examples and embodiments may be practiced in other specific forms. The patentable scope of this invention is defined by the claims and may include other examples that occur to those skilled in the art. Such other examples are intended to be within the claims if they have structural elements that do not differ from the literal language of the claims, or if they include equivalent structural element with insubstantial differences from the literal languages of the claims.

What is claimed is:

1. An apparatus comprising:
   a detection module within a power control device that detects an abnormal condition, the abnormal condition indicative of one or more of
      an impending failure of the power control device; and
      a condition within the power control device indicative of a parameter being outside of a specified limit,
      wherein the power control device controls power to one or more power devices in a power distribution system; and
   a signal transmit module that transmits a capture signal to a transient capture meter, the transient capture meter metering transient conditions of a branch of the power distribution system comprising the power control device, wherein the capture signal instructs the transient capture meter to capture one or more of current and voltage waveforms relevant to a time when the detection module detected the abnormal condition.

2. The apparatus of claim 1, wherein the signal transmit module transmits the capture signal over a control communication network.

3. The apparatus of claim 2, wherein the control communication network transmits control signals to a plurality of power control devices that control power to power devices in the power distribution system and to one or more transient capture meters.

4. The apparatus of claim 2, wherein the control communication network uses a transmission pathway different than power transmission within the power distribution system.

5. The apparatus of claim 1, wherein the signal transmit module further transmits the capture signal to additional transient capture meters that meter the power distribution system at various locations.

6. The apparatus of claim 1, wherein detecting the impending failure of the power control device comprises one or more of detecting an impending failure of a component in the power control device and detecting a condition in the power control device known to cause a component in the power control device to fail.

7. The apparatus of claim 1, wherein detecting the condition within the power control device indicative of a parameter being outside of a specified limit comprises one or more of detecting a control signal is outside of a specified range, detecting a voltage of a component being outside of a specified range, detecting a current of a component being outside of a specified range, and detecting a power signal outside of a power quality limit.

8. The apparatus of claim 1, wherein the transient capture meter comprises a buffer that stores waveforms of a sufficient time period to capture transient data at least at the time that the detection module detects the abnormal condition accounting for delays between receipt of the capture signal and detection of the abnormal condition.

9. The apparatus of claim 1, further comprising an event data module that transmits data related to the abnormal condition.

10. The apparatus of claim 9, wherein the data related to the abnormal condition comprises one or more of data related to failure of the power control device and data related to the condition within the power control device indicative of the parameter being outside of the limit.

11. The apparatus of claim 9, wherein the data related to the abnormal condition comprises data not available external to the power control device.

12. The apparatus of claim 1, wherein the capture signal comprises a time when the detection module detected the abnormal condition.

13. A method comprising:
    detecting, within a power control device, an abnormal condition, the abnormal condition indicative of one or more of
        an impending failure of the power control device; and
        a condition within the power control device indicative of a parameter being outside of a specified limit,
        wherein the power control device controls power to one or more power devices in a power distribution system; and
    transmitting a capture signal to a transient capture meter, the transient capture meter metering transient conditions of a branch of the power distribution system comprising the power control device, wherein the capture signal instructs the transient capture meter to capture one or more of current and voltage waveforms relevant to a time when the abnormal condition is detected.

14. The method of claim 13, wherein transmitting the capture signal to a transient capture meter comprises transmitting the capture signal over a control communication network.

15. The method of claim 13, wherein transmitting the capture signal comprises transmitting the capture signal to a plurality of transient capture meters that meter the power distribution system at various locations.

16. The method of claim 13, wherein the transient capture meter comprises a buffer that stores waveforms of a sufficient time period to capture transient data at least at the time of detecting the abnormal condition accounting for delays between receipt of the capture signal and detection of the abnormal condition.

17. An apparatus comprising:
    a signal receiver module within a transient capture meter that receives a transient capture signal from a power control device, the transient capture meter metering transient conditions of a branch of a power distribution system comprising the power control device, the power control device controlling power to one or more power devices in the power distribution system, the power control device
        detects an abnormal condition, the abnormal condition indicative of one or more of an impending failure of the power control device, and a condition within the power control device indicative of a parameter being outside of a specified limit; and
        transmits the capture signal to the transient capture meter in response to detecting the abnormal condition; and
    a transient capture module, within the transient capture meter, that captures one or more of current and voltage waveforms relevant to a time when the power control device detected the abnormal condition.

18. The apparatus of claim 17, further comprising a signal transmit module that transmits the capture signal to additional transient capture meters.

19. The apparatus of claim 17, wherein the capture signal is received over a control communication network.

20. The apparatus of claim 17, wherein the transient capture meter comprises a buffer that stores waveforms of a sufficient time period to capture transient data at least at the time that the power control device detects the abnormal condition accounting for delays between receipt of the capture signal and detection of the abnormal condition.

* * * * *